(12) United States Patent
Degani et al.

(10) Patent No.: US 6,433,411 B1
(45) Date of Patent: Aug. 13, 2002

(54) PACKAGING MICROMECHANICAL DEVICES

(75) Inventors: Yinon Degani, Highland Park; Thomas Dixon Dudderar, Chatham; King Lien Tai, Berkeley Heights, all of NJ (US)

(73) Assignees: Agere Systems Guardian Corp., Orlando, FL (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/575,883

(22) Filed: May 22, 2000

(51) Int. Cl.[7] .............................................. H01L 23/02
(52) U.S. Cl. ...................................................... 257/678
(58) Field of Search ................................. 257/678–798

(56) References Cited

U.S. PATENT DOCUMENTS

| | | | | |
|---|---|---|---|---|
| 5,506,448 A | * | 4/1996 | Morishige | 257/697 |
| 5,739,585 A | * | 4/1998 | Akram et al. | 257/698 |
| 5,817,535 A | * | 10/1998 | Akram | 438/15 |
| 5,901,046 A | * | 5/1999 | Otha et al. | 361/760 |
| 6,054,757 A | * | 4/2000 | Kobayashi | 257/690 |
| 6,117,708 A | * | 9/2000 | Wensel | 438/118 |

* cited by examiner

*Primary Examiner*—Fetsum Abraham
*Assistant Examiner*—Leonardo Andujar
(74) *Attorney, Agent, or Firm*—Peter V. D. Wilde; Thomas, Kayden, Horstemeyer & Risley LLP

(57) ABSTRACT

The specification describes packaging assemblies for microelectronic machined mechanical systems (MEMS). The MEMS devices in these package assemblies are based on silicon MEMS devices on a silicon support and the MEMS devices and the silicon support are mechanically isolated from foreign materials. Foreign materials pose the potential for differential thermal expansion that deleteriously affects optical alignment in the MEMS devices. In a preferred embodiment the MEMS devices are enclosed in an all-silicon chamber. Mechanical isolation is also aided by using a pin contact array for interconnecting the silicon support substrate for the MEMS devices to the next interconnect level. The use of the pin contact array also allows the MEMS devices to be easily demountable for replacement or repair.

16 Claims, 2 Drawing Sheets

PACKAGING MICROMECHANICAL DEVICES

FIELD OF THE INVENTION

This invention relates to electronic assembly technology and more specifically to packaging micro-electronic machined mechanical systems (MEMS).

BACKGROUND OF THE INVENTION

New photonic devices are in development that use micromechanical elements. In principal, micromechanical elements can be built on a variety of platforms. However, the substrate of choice is typically a semiconductor wafer, e.g. silicon. Highly and often elegantly engineered silicon processing can be used to make new device structures that combine the mechanical and optical properties of silicon. An advanced technology, silicon optical bench technology, has been developed to implement this approach. Typically the micromechanical devices or subassemblies are formed in large integrated arrays, referred to here as MEMS, to perform a common function in a parallel mode. The substrate for the arrays is usually a silicon wafer or a large silicon chip. In most instances the MEMS device arrays comprise photonic devices, and are accessed with optical I/O signals.

Among the most promising of the photonic MEMS devices are optical cross connect devices. These may be used in optical networking for routing optical signals from one array of optical channels to another. Optical cross connects are typically made in the form of compact arrays of micromechanical mirrors. An input array, usually a linear array, of optical waveguides are arranged to address the mirror array, which steers optical beams from the input array to a corresponding output array of optical waveguides. The input and output optical channels may be optical waveguides in an optical integrated circuit, or may be arrays of optical fibers.

These optical cross connect devices can switch one of a large number of optical inputs between a selected one of a large number of optical outputs. For example, a 10 fiber input array used with a 10 fiber output array has the capacity to make 1000 individual connections. Each channel typically has tens or, in future systems, hundreds of channels wavelength division multiplexed (WDM) together. The information handling capacity of such a switch is extremely large.

State of the art optical networking systems require large compact arrays of micromechanical mirrors. The micromechanical mirrors are electrically addressed, and mirror tilt is controlled by selectively applied electrostatic fields. In a standard optical networking system, for n input fibers an $n^2$ mirror array is used. Each input fiber accesses an associated row of, for example, ten mirrors and each of the ten mirrors addresses one of ten output fibers. In a typical operating cross connect, for example, the first three mirrors are not activated, i.e. do not intersect the beam path, and the fourth is electrically tilted to intersect the beam path and steer the beam to its associated fiber. In this way the first fiber can address a selected one of ten mirrors and thus a selected one of ten fibers. This $n^2$ mirror array requires two tilt positions, on and off. A more efficient mirror arrangement uses 2n mirrors for the same 10×10 switch. It operates by steering the optical beam to one of ten positions, and has two way tilt capability.

Mirrors for optical cross connects in current state of the art devices may be formed using the silicon bench technology mentioned above. A silicon wafer platform is used as the support substrate, and the mirrors are fabricated on the silicon platform using known micromechanical device fabrication techniques. Some of these techniques have been developed for optical modulator devices such as the Mechanical Anti-Reflection Switch (MARS) device. See e.g. U.S. Pat. No. 5,943,155 issued Aug. 24, 1999, and U.S. Pat. No. 5,943,571, issued Sep. 7, 1999. The fabrication approach used in this technology is to fabricate a layered structure on a silicon substrate, with the top layer of a reflecting material, and dissolve away the intermediate layer(s) leaving a suspended reflector.

It should be evident from the foregoing description that optical alignment in MEMS assemblies, i.e. packaged MEMS device arrays, is extremely critical. Alignment defects occur during manufacture and also arise in the use environment, i.e. after manufacture. The former can be dealt with by process control and thorough testing. The latter however, are more abstruse and unpredictable. They may occur as the result of mechanical perturbations in the assembly caused, for example, by handling. More typically, they result from differential thermal expansion due to temperature variations in the use environment. This produces strains which may impair the precise alignment of optical elements in the assembly. To preserve critical alignment, the MEMS device arrays may be mounted in a robust container with a suitable transparent opening for accessing the array with light signals. It many cases it is desirable to mount them in hermetic packages. However these protective packages often exacerbate the thermo-mechanical problems caused by differential thermal expansion.

SUMMARY OF THE INVENTION

We have developed a packaging technology for MEMS assemblies in which the MEMS device arrays are mounted on a silicon wafer platform and, in a preferred embodiment, are encased in a silicon chamber. The silicon chamber may be hermetically sealed. The use of an all silicon package for the MEMS device array substantially eliminates thermomechanical instabilities. Mechanical instabilities are also reduced by using a contact pin array for interconnecting the silicon support substrate for the MEMS devices to the next interconnect level. The use of the contact pin array also allows the MEMS devices to be easily demountable for replacement or repair.

DETAILED DESCRIPTION

Figure 1:
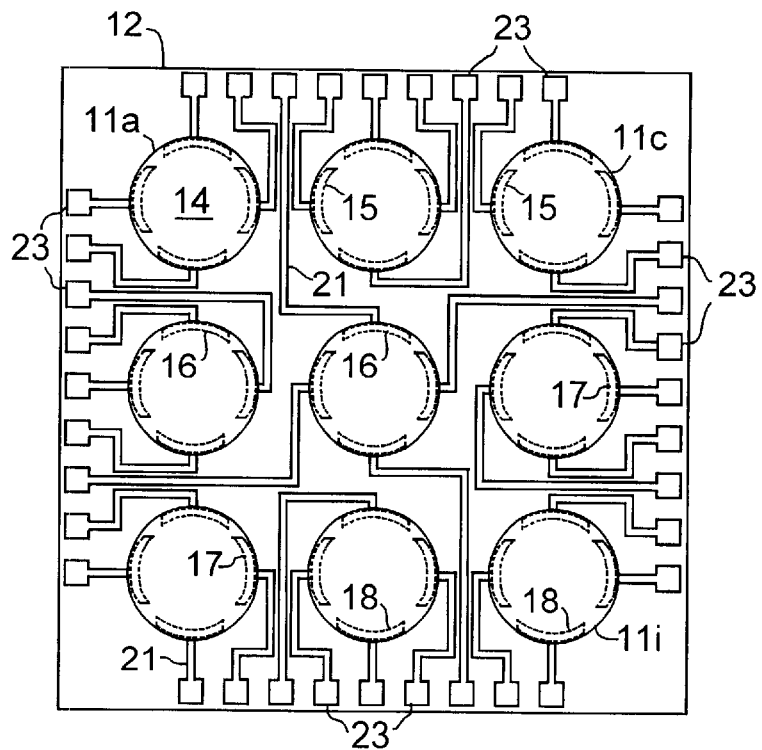
FIG. 1 is a schematic view of a MEMS device array, in this embodiment a mirror with four way tilt for an optical cross connect, that is presented by way of example of devices that may be packaged using the invention.

Referring to FIG. 1, a 3×3 micromechanical mirror array is shown by way of example of a MEMS device array that is advantageously packaged according to the invention. The 3×3 array of micromechanical devices comprises nine micromechanical mirrors, shown as 11a–11i, mounted on silicon substrate 12. The individual mirror devices in the array comprise mirror surface 14, with four way tilt capability, and drive electrodes 15–18, shown in phantom. Control of the tilt is effected electrostatically by application of voltages selectively to electrodes 15–18. This normally requires that each of the four electrodes be independently addressable. Runners 21 interconnect the four electrodes for each device 11a–11i to bond pads 23. An array of n devices, requires 4n independent electrical interconnections. In principle, fewer electrical connections can be used but the preferred choice is that shown. This interconnection requires a total of 36 individual runners and bond pads for the 3×3 array.

In an optical cross connect, the mirrors in the array communicate with optical beams in optical waveguides. The waveguides, and the overall system architecture, are not part of the invention and for simplicity in presenting the invention are not shown. However, it is well known that optical cross connects in the form of mirror arrays require compact mirror arrays, i.e., close packing of the mirrors, for efficient design of the overall system.

The size, 3×3, of the array is chosen here for convenience in illustrating the complexity and critical alignment needs for large micromechanical device arrays. Device arrays in current development may have hundreds or even thousands of micromechanical mirrors on a single silicon platform. As the number of micromechanical devices is multiplied, the potential for alignment problems and other mechanical defects rises dramatically.

The micromechanical mirror device is given by way of example only of a wide variety of electrically driven micromechanical elements that may be fabricated in large arrays on a common substrate. It is presented for illustration of the problems associated with integrating large micromechanical device arrays requiring mechanical movement and optical access.

Due to the obvious fragility of MEMS devices, they should be well protected from hostile ambients. For normal service environments they should be entirely enclosed and preferably hermetically sealed, while still allowing optical access. Due to the mechanical nature of MEMS devices, the package should provide mechanical integrity and dimensional stability. A package design providing these attributes is shown in FIG. 2.

Figure 2:
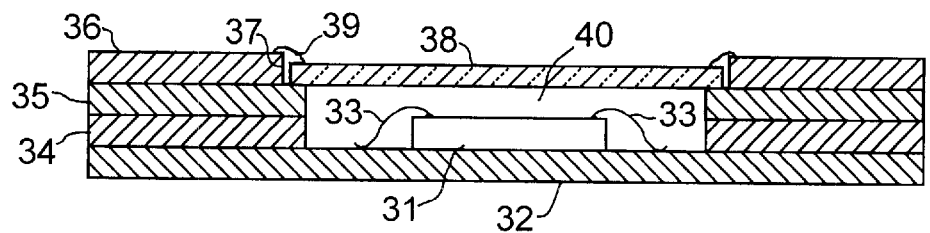
FIG. 2 is a schematic representation of a MEMS assembly comprising a silicon wafer platform and silicon chamber for enclosing the MEMS device array of FIG. 1.

In FIG. 2, a silicon substrate 32 is shown with MEMS device 31 mounted on the silicon substrate. The silicon substrate may be single crystal, polycrystal (polysilicon) or amorphous silicon. The MEMS device may be die bonded to substrate 32 and interconnected using wire bonds 33. The wire bonds interconnect bond pads (23 in FIG. 1) to substrate pads (not shown). It will be understood by those skilled in the art that any of a variety of mounting schemes may be used, with the main objective being matching the coefficient of thermal expansion, $t_c$, of the MEMS device to the substrate on which it rests. The electrical interconnection between MEMS device 31 and the substrate 32 can take many forms. With a silicon substrate, it is convenient to use standard IC interconnect technology. Typically this will comprise a grown or deposited oxide, and aluminum metallization interconnect patterns photolithographically formed on the oxide. According to one embodiment of the invention, a silicon chamber is provided to enclose the MEMS device. In the arrangement shown in FIG. 2, the sidewalls of the chamber are constructed with silicon wafers 34, 35 and 36. The individual wafers are prepared with large openings to accommodate the MEMS device as shown. The openings may be formed using deep etching techniques, such as RIE, or may be laser drilled, or produced by other suitable methods. After forming the openings, the wafers may be affixed together using standard wafer bonding methods. For example, the surfaces of the wafers may be oxidized to form a very thin oxide, e.g. 0.1–5 microns, and the wafers bonded together using thermocompression bonding. It is preferred that no "foreign" material (other than, in the prior example, a very thin $SiO_2$ layer) be used in constructing the sidewalls and bottom of the silicon chamber. This preserves the material homogeneity and the attendant uniform thermomechanical properties for the whole assembly.

The top of the chamber 40 is capped with a transparent windowpane 38. The windowpane may be fused quartz of other suitable material transparent to the wavelength used for the optical beams being deflected in the MEMS device. Typically this wavelength is 1.3 or 1.55 nm. In FIG. 2 the sidewall 37 of the opening in the top silicon wafer 36 is indented from the chamber 40 to provide a ledge for windowpane 38. It is preferred that the opening in wafer 36 be larger than the width of the window. This allows the window pane, which comprises the only material forming the chamber which is not precisely thermomechanically matched, to "float". Thus differential thermal expansion between the chamber walls and the windowpane is accommodated by the space between the chamber wall at the windowpane seat, and the windowpane itself. The windowpane can be sealed to the chamber using a resilient filler/ adhesive, which can be selected from, e.g., a variety of silicone materials.

In FIG. 2, three silicon wafers are used in forming the sidewalls of the sealed chamber 40. The number of wafers needed will depend on the thickness of the wafers, the height of the MEMS device, and the standoff desired between the top of the MEMS device and the windowpane 38. If the substrate for the MEMS device is thinned by conventional thinning techniques, then a single standard 20–30 mil thick wafer may be sufficient for constructing the chamber sidewall.

The use of silicon wafers for forming the chamber sidewall is but one example of several options that will occur to those skilled in the art. Alternatively, a collar of silicon may be attached to the silicon substrate 32. The collar may also be machined to provide a ledge for the windowpane. The windowpane may also rest on top of the collar, or the top wafer 36 in FIG. 2, i.e. without a seat, to provide a similar result.

It should be evident to those skilled in the art that the size of the various elements in these figures are for convenience in illustrating the principles of the invention and are not necessarily to scale. The 3×3 array shown is for convenience in exposition. A more typical array, as suggested above, is 32×32 micromechanical devices on a 3.2 cm substrate, which allows an approximate single device size of 1 $mm^2$. Also, the array configuration, with x- and y-rows, is by way of example only. Other arrangements, e.g. with alternate rows offset and rows interleaved, may also be used.

Substrate 32 will typically have an array of bond pads arranged for interconnection to the next interconnection level. Several options are available for interconnecting the MEMS device. Substrate 32 may comprise a standard single level printed circuit. Multi-level interconnections can also be used to allow crossovers. Substrate 32 may be a silicon intermediate interconnection substrate, or a translator substrate, as described and claimed in U.S. patent applications Ser. Nos. 09/149,803 and 09/149,804, both filed Sep. 8, 1998.

The individual elements of the MEMS device, i.e. the mirrors in the embodiments shown, are shown circular in configuration. Alternatively, they may be square or rectangular.

Figure 3:
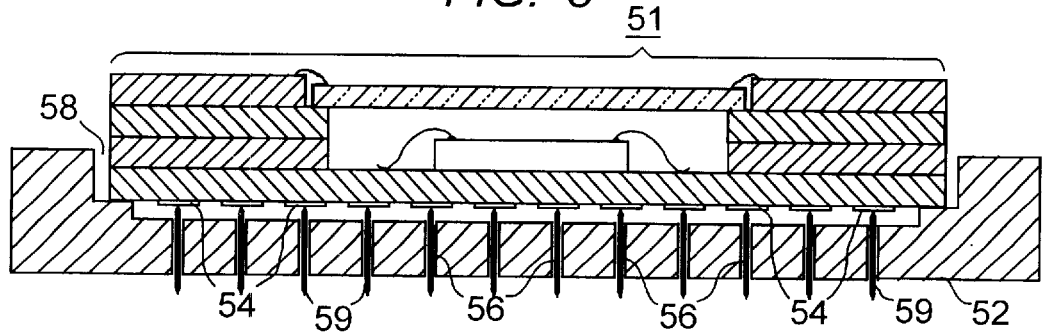
FIG. 3 is a schematic representation similar to that of FIG. 2 showing the combination of a silicon chamber and an interconnection substrate for interconnecting a MEMS assembly.

To further enhance mechanical isolation of the chamber assembly of FIG. 2 from external mechanical stress, the interconnections to the chamber assembly may be made using a floating contact pin array. This embodiment is shown in FIG. 3. The silicon chamber assembly, indicated generally at 51, is supported by interconnect substrate 52. The material of interconnect substrate 52 may be silicon but will more likely be ceramic or epoxy. Contact pads 54 are shown on the bottom of the chamber assembly 51, which interconnect with the MEMS device within the chamber. The latter interconnection may be made by any suitable arrangement, such as vias extending through the bottom of the chamber assembly. The interconnect substrate 52 is provided with a plurality of spring loaded contact pins 56 which bear against contact pads 54 but are not attached thereto. This allows the electrical connections to mechanically float, thus preventing differential thermal expansion, or other mechanical stress, on interconnect substrate 52, or on the next interconnect level, from being translated to the chamber assembly 51. The interconnect substrate 52 is provided with recess 58 into which the chamber assembly is inserted. A space is provided around the chamber assembly in the recess so that the chamber assembly is allowed to float on interconnect substrate 52, thereby eliminating strains in interconnect substrate 52 from imposing stresses on the chamber assembly. The space is large enough to accommodate strain relief but small enough to prevent movement of any of the contact pads 54 away its associated contact pin 56. The bottom of the contact pin array is electrically connected to a printed wiring board or other interconnect substrate. In the embodiment shown, the bottom of the pins 56 comprise contact pins similar to the top contact pins and bear against contact pads on the next interconnect substrate in the same way described above. Alternatively, the bottom of the contact pins may be affixed to contact pads and the contact pads are used to interconnect the MEMS assembly to a printed wiring board or other support/interconnect assembly next level by, e.g. solder bumps. The next level may be a ceramic, epoxy or silicon interconnection substrate.

An important advantage of the MEMS assembly of FIG. 3 is that the silicon chamber assembly 51 is easily demounted and replaced. In a typical state of the art system, the overall system may include more than one MEMS device. It will also include many integrated circuits for several functions, e.g. drive circuits for the MEMS, amplifiers, digital-to-analog converters (DACS), etc. These multiple elements are electrically connected in a large, complex, interconnection system. Failure of any module in the system is advantageously met with rapid repair facility. Thus in the MEMS assembly shown, the MEMS device is demountable for rapid response repair or replacement.

Figure 4:
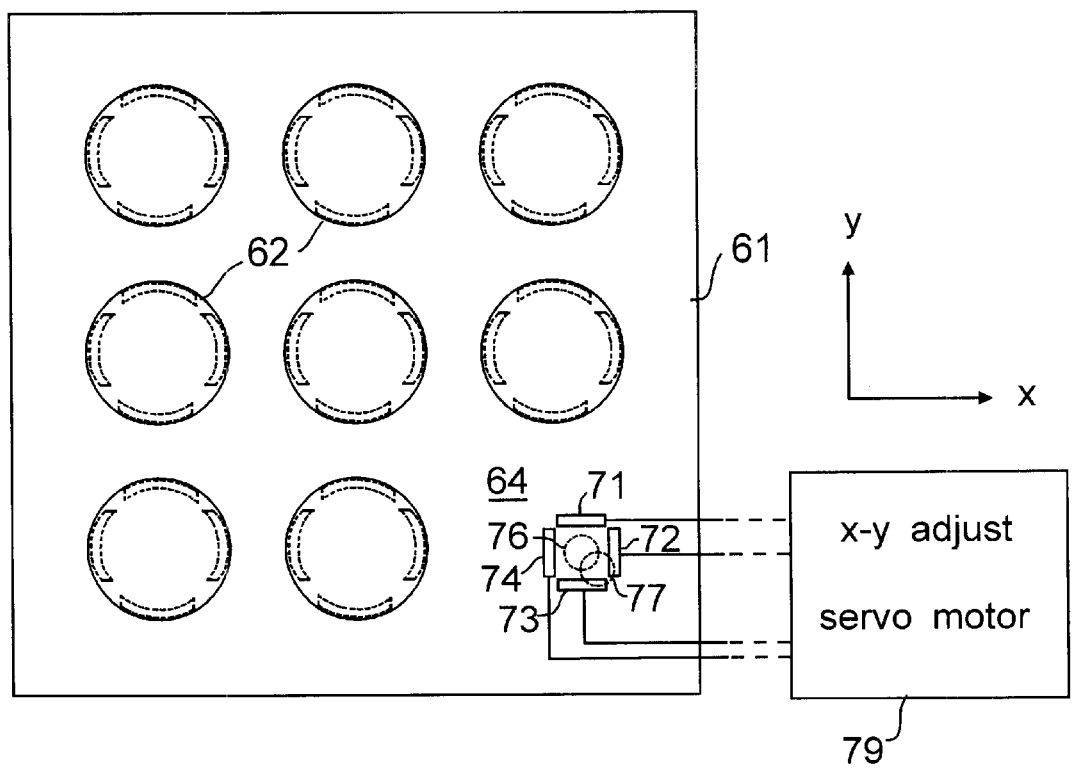
FIG. 4 is a schematic view of a MEMS device with means for dynamically positioning the MEMS device with respect to an I/O optical beam.

Those skilled in the art will recognize that the same mechanisms used in FIG. 3 for mechanical isolation of the silicon chamber assembly from the rest of the apparatus, and for the demountable characteristic just mentioned, also allows the MEMS device in the chamber assembly to be easily aligned and realigned with the I/O optical beams. This alignment can be automated for dynamic alignment. One approach is shown in FIG. 4. A reference grid, indicated generally at 64, is formed on a surface of the MEMS device 61. The MEMS device comprises an array of mirrors 62 similar to that described in conjunction with FIG. 1. The reference grid comprises a group of photocells 71–74 arranged to detect changes in the position of the optical beam that addresses the MEMS. A small portion of the input beam is tapped using a conventional splitter (not shown) and is focused onto the center of the photocell array between the individual photocells as shown. The position of the beam when properly aligned is indicated by circle 76. If the position of the input beam relative to the mirror array strays, one or more of the photocells 71–74 becomes activated. The voltage from the activated photocell is used to drive a servo motor 79 attached to either the MEMS device, or the chamber assembly, to re-establish proper alignment. In FIG. 4, when the position of the optical beam is coincident with circle 76, i.e. properly aligned, no light impinges on any of the photocells 71–74 and the mechanical alignment means, servo motor 79, is inactive. If the beam strays to the position represented by circle 77, light is incident on photocells 72 and 73 which activates the servo motor to move substrate 61 until the beam is repositioned at circle 76. Photocells 72 and 74 control plus and minus movement on the x-coordinate, and photocells 71 and 73 control plus and minus movement on the y-coordinate. The input optical beam can stray from the center position due to unwanted changes in the optics controlling the input beam, or, as addressed above, mechanical changes in the position of the chamber assembly. If the MEMS device is constructed on a silicon substrate, the photocell array can be easily integrated into the substrate. Alternatively, the photocell array can be formed on the silicon platform 32 shown in FIG. 2.

Figure 5:
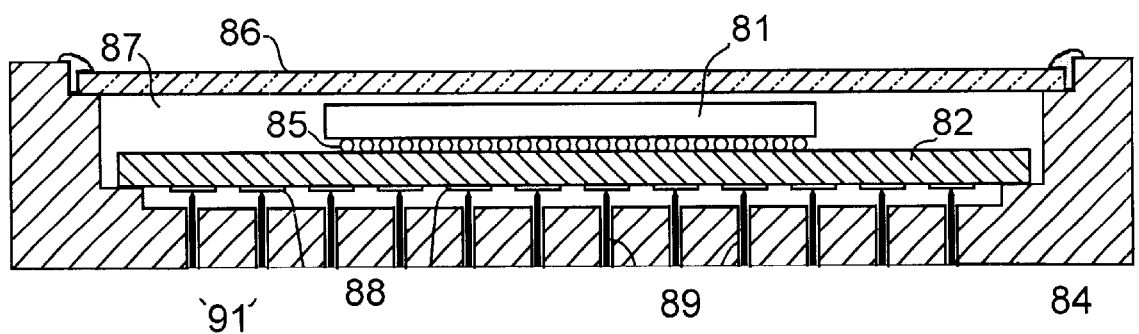
FIG. 5 is a view similar to that of FIG. 3 showing an alternative MEMS assembly.

The use of a contact pin array, as described in conjunction with FIG. 3, enables an alternative arrangement wherein the chamber containing the MEMS device can be simplified using part of the substrate (52 in FIG. 3). Such an embodiment is shown in FIG. 5 where the MEMS device is shown at 81, supported by silicon substrate 82. The substrate comprising the floating contact pin array is shown at 84. The silicon sidewalls of the chamber have been replaced by the sidewalls of substrate 84. The MEMS device is shown larger than in FIG. 3, and is shown with solder bumps 85 instead of wire bonds to illustrate the option of interconnecting the MEMS mirror drive electrodes through the MEMS device support substrate using through holes, or vias, and solder bumps connected to the vias. The window pane 86 is supported by substrate 84 and can be rigidly affixed thereto since it is not integral with the MEMS assembly as in the embodiment of FIG. 2. In this embodiment, mechanical stresses resulting from differential thermal expansion of the windowpane material are isolated from the MEMS device through the floating contact pin array. The chamber 87, containing the fragile MEMS device, can be sealed against hostile ambients. An advantage of the arrangement shown in FIG. 5, where the contact pins extend only from the top surface of interconnect substrate 84, is that the bottom of the openings through the substrate that accommodate the contact pins can be sealed with contact pads 91, thus forming a hermetically sealed package for the MEMS device and also for the contact pins. The use of contact pin arrays is effective for mechanical isolation, and convenient demounting, as described above, but the reliability of unattached pin/pad arrangements is often less than desired. Frequently this is due to corrosion or contamination of the pin/pad at the contact interface. Sealing this interface from the environment improves long term reliability of the contacts.

In the embodiments described above, a single micromechanical device array chip is shown. However, as will occur to those skilled in the art, substrate 82 of FIG. 5, for example, may contain several or many sites for micromechanical device array chips depending on the size of the assembly and the size of the various elements.

In the embodiment represented by FIG. 1, the MEMS array, here a mirror array, is formed or mounted on the top surface of the silicon substrate. For some device arrays, devices that are already essentially complete may be attached to the substrate. In other embodiments the device array may be formed, i.e. built, on the substrate. In either case, referred to generically as forming the MEMS device on the top side of the substrate, electrical contacts associated with the device array are interconnected typically by printed circuit runners to conductive vias on the top side of the substrate. An interconnection pattern, formed on the bottom side of the substrate, is interconnected to the bottom side of the vias.

In the embodiments described above, the MEMS device is formed on just one side of the substrate with the other side of the substrate comprising interconnection means. However, embodiments can be envisioned wherein micromechanical elements are provided on both sides of the substrate. Also, two substrates with micromechanical arrays as described may be arranged in a chip-on-chip configuration. The chip-on-chip arrangement, in the case where the micromechanical array is optically active, i.e. has an optical input/output, should be configured to allow optical access to the optical device array.

The term silicon when used herein to describe the material of an element of the MEMS assembly is intended to include single crystal silicon, polycrystal silicon (polysilicon) or amorphous silicon.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A micro-electronic machined mechanical (MEMS) assembly comprising a silicon chamber having a silicon base and silicon sidewalls, and a MEMS device mounted on the silicon base within the silicon chamber.

2. The assembly of claim 1 wherein the MEMS device is a photonic device and wherein the assembly further includes a chamber top comprising a transparent window.

3. The assembly of claim 2 wherein the silicon base, silicon sidewalls, and chamber top form a hermetically sealed container.

4. A micro-electronic machined mechanical (MEMS) assembly comprising:
   (a) an interconnect substrate with a top and bottom surface, an array of contact pins extending from the top surface of the interconnect substrate,
   (b) a chamber assembly mounted on the interconnect substrate, the chamber assembly comprising:
      (i) a silicon substrate with a top and bottom surface,
      (ii) silicon sidewalls attached to the top surface of the silicon substrate, the silicon sidewalls combining with the silicon substrate to form a silicon chamber,
      (iii) a MEMS device mounted on the top surface of the silicon substrate within the silicon chamber, and
      (iv) a plurality of electrical contact pads on only the bottom surface of the silicon substrate, each of the electrical contact pads aligned with and contacting a contact pin extending from the top surface of the interconnect substrate.

5. The assembly of claim 4 wherein the MEMS device is a photonic device and wherein the assembly further includes a chamber top for the chamber assembly, the chamber top comprising a transparent window.

6. The assembly of claim 5 wherein the silicon substrate, silicon sidewalls, and chamber top form a hermetically sealed chamber.

7. The assembly of claim 4 further including a photodiode array on the MEMS assembly and mechanical means for moving the MEMS assembly in response to signals from the photodiode array.

8. The assembly of claim 4 wherein the each of the electrical contact pads aligned with and contacting a contact pin extending from the top surface of the interconnect substrate contacts the contact pin but is not attached thereto.

9. A micro-electronic machined mechanical (MEMS) assembly comprising:
   (a) an interconnect substrate with a top and bottom surface, an array of contact pins extending from the top surface of the interconnect substrate,
   (b) a silicon substrate mounted on the interconnect substrate, the silicon substrate having a top surface and a bottom surface,
   (c) a MEMS device mounted on the top surface of the silicon substrate,
   (d) a plurality of electrical contact pads on only the bottom surface of the silicon substrate, each of the electrical contact pads aligned with and contacting a contact pin extending from the top surface of the interconnect substrate.

10. The assembly of claim 9 wherein the interconnect substrate has a recess formed in the central region thereof, and the silicon substrate and the MEMS device are contained within the recess.

11. The assembly of claim 10 further including a top covering the recess and wherein the top comprises a transparent window.

12. The assembly of claim 11 wherein the interconnection substrate and the top covering the recess in the interconnection substrate form a hermetically sealed chamber.

13. The assembly of claim 9 further including a photodiode array on the MEMS assembly and mechanical means for moving the MEMS assembly in response to signals from the photodiode array.

14. The assembly of claim 9 wherein the array of contact pins extending from the top surface of the interconnect substrate also extends from the bottom surface of the interconnect substrate.

15. The assembly of claim 14 further including a system interconnect substrate having an array of contact pads on the surface thereof, with the interconnect substrate supported by the system interconnect substrate and with the array of contact pins contacting the contact pads of the system interconnect substrate.

16. The assembly of claim 9 wherein the each of the electrical contact pads aligned with and contacting a contact pin extending from the top surface of the interconnect substrate contacts the contact pin but is not attached thereto.

* * * * *